(12) United States Patent
Oki et al.

(10) Patent No.: US 10,704,146 B2
(45) Date of Patent: Jul. 7, 2020

(54) SUPPORT ASSEMBLY FOR SUBSTRATE BACKSIDE DISCOLORATION CONTROL

(71) Applicant: Applied Materials, Inc., Santa Clara, CA (US)

(72) Inventors: Shinichi Oki, Chiba-Ken (JP); Yuji Aoki, Yokohama (JP); Peter Demonte, Millbrae, CA (US); Yoshinobu Mori, Ohmura (JP)

(73) Assignee: Applied Materials, Inc., Santa Clara, CA (US)

( * ) Notice: Subject to any disclaimer, the term of this patent is extended or adjusted under 35 U.S.C. 154(b) by 768 days.

(21) Appl. No.: 14/973,079

(22) Filed: Dec. 17, 2015

(65) Prior Publication Data

US 2016/0204005 A1 Jul. 14, 2016

Related U.S. Application Data

(60) Provisional application No. 62/102,375, filed on Jan. 12, 2015.

(51) Int. Cl.
C23C 16/455 (2006.01)
C23C 16/458 (2006.01)
(Continued)

(52) U.S. Cl.
CPC ........ C23C 16/458 (2013.01); C23C 16/4586 (2013.01); C23C 16/46 (2013.01);
(Continued)

(58) Field of Classification Search
CPC ......... H01L 21/67109; H01L 21/68742; C23C 16/458; C23C 16/4586; C23C 16/46; C23C 16/455; C23C 16/466; C30B 25/12
(Continued)

(56) References Cited

U.S. PATENT DOCUMENTS 4,798,165 A * 1/1989 deBoer ................. C23C 16/455
                                                                118/715
6,096,135 A * 8/2000 Guo ...................... C23C 16/455
                                                                118/715
(Continued)

FOREIGN PATENT DOCUMENTS

CN          1862204 A      11/2006
JP        H11079888 A       3/1999
(Continued)

OTHER PUBLICATIONS

PCT international search report and written opinion of PCT/US2015/065056 dated Mar. 30, 2016.
(Continued)

Primary Examiner — Aiden Lee
(74) Attorney, Agent, or Firm — Patterson + Sheridan, LLP

(57) ABSTRACT

A processing chamber for processing a substrate is disclosed herein. In one embodiment, the processing chamber includes a support shaft assembly. The support shaft assembly has a ring shaped susceptor, a disc shaped heat plate, and a support shaft system. The support shaft system supports the susceptor and the heat plate, such that the susceptor is supported above the heat plate defining a gap between the heat plate and the susceptor. In another embodiment, the heat plate includes a plurality of grooves and the susceptor includes a plurality of fins. The fins are configured to sit within the grooves such that the susceptor is supported above the heat plate, defining a gap between the heat plate and the susceptor. In another embodiment, a method of processing a substrate in the aforementioned embodiments is disclosed herein.

17 Claims, 9 Drawing Sheets

(51) Int. Cl.
  *H01L 21/687*  (2006.01)
  *C23C 16/46*  (2006.01)
  *H01L 21/67*  (2006.01)
(52) U.S. Cl.
  CPC .. *H01L 21/67109* (2013.01); *H01L 21/68742* (2013.01); *C23C 16/455* (2013.01)
(58) Field of Classification Search
  USPC ................ 118/728–730; 156/345.51–345.53
  See application file for complete search history.

(56) References Cited

U.S. PATENT DOCUMENTS

| | | | |
|---|---|---|---|
| 6,296,712 B1* | 10/2001 | Guo | C23C 16/455 118/728 |
| 2003/0075274 A1 | 4/2003 | Halpin et al. | |
| 2010/0086784 A1* | 4/2010 | Patalay | H01L 21/68742 428/411.1 |
| 2011/0120366 A1 | 5/2011 | Higashi et al. | |
| 2011/0155058 A1* | 6/2011 | Carlson | C23C 16/46 118/722 |
| 2012/0073503 A1 | 3/2012 | Huang et al. | |
| 2013/0193132 A1 | 8/2013 | Serebryanov et al. | |
| 2013/0230814 A1 | 9/2013 | Dunn et al. | |

FOREIGN PATENT DOCUMENTS

| | | |
|---|---|---|
| JP | 2008227487 A | 9/2008 |
| JP | 2011109035 A | 6/2011 |
| JP | 2012124476 A | 6/2012 |
| WO | WO-2013016266 A1 | 1/2013 |

OTHER PUBLICATIONS

Office Action from Japanese Patent Application No. 2017-536797 dated Jan. 6, 2020.

Office Action for Chinese Patent Application No. 201580073204.0 dated Feb. 3, 2020.

\* cited by examiner

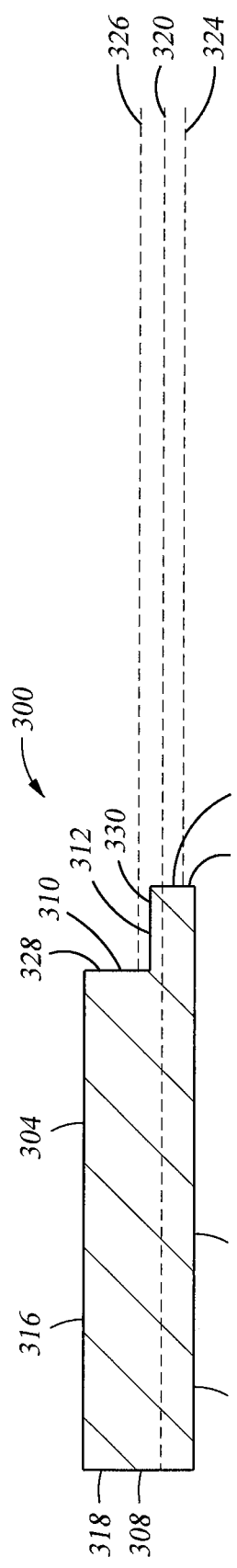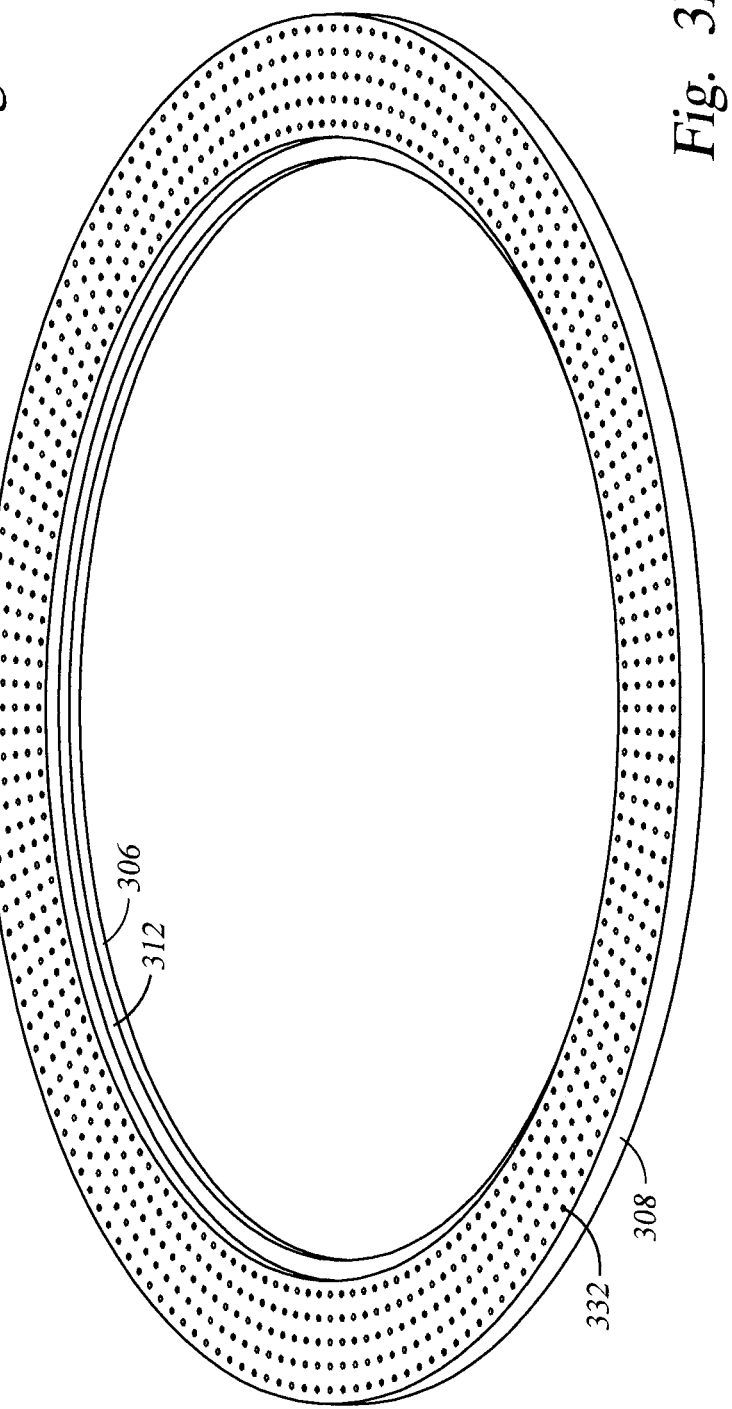

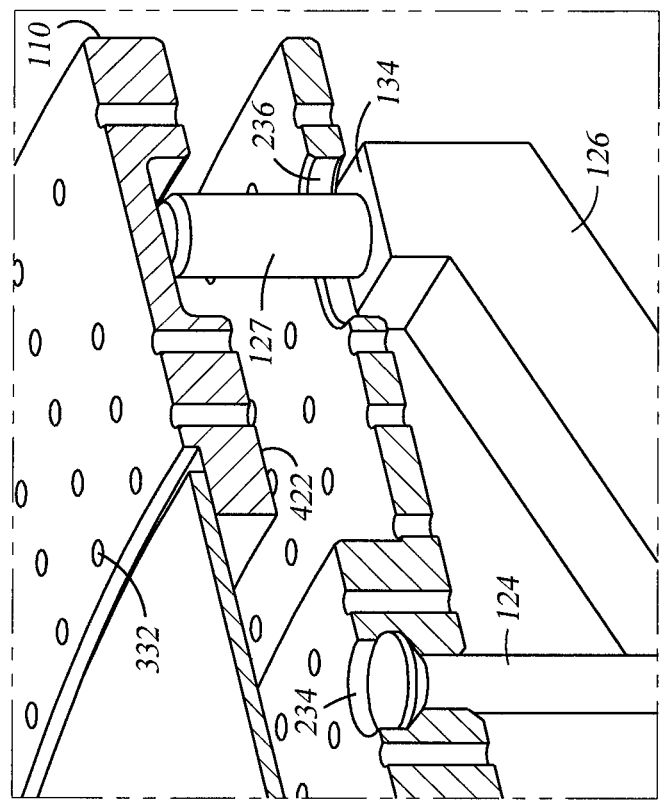
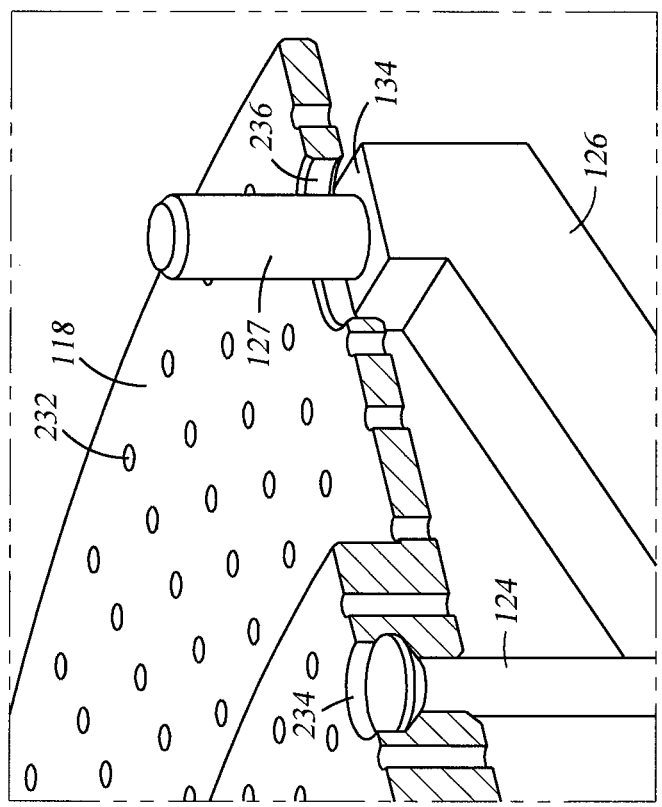
Fig. 4D
Fig. 4C

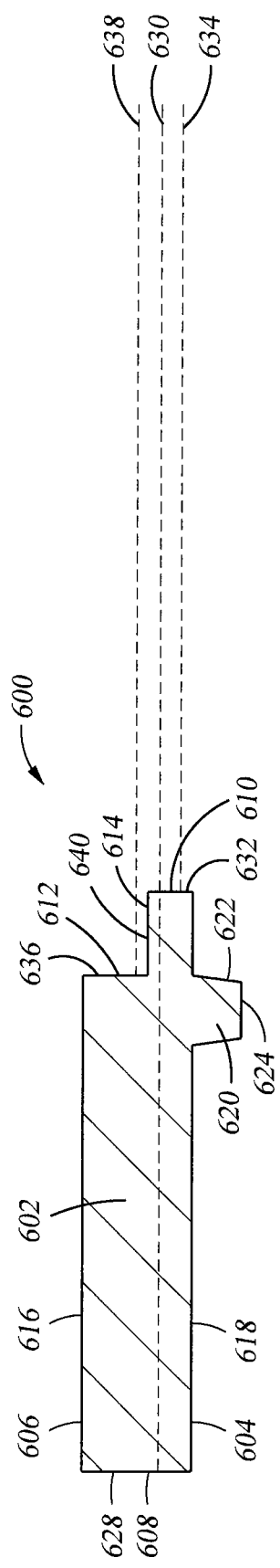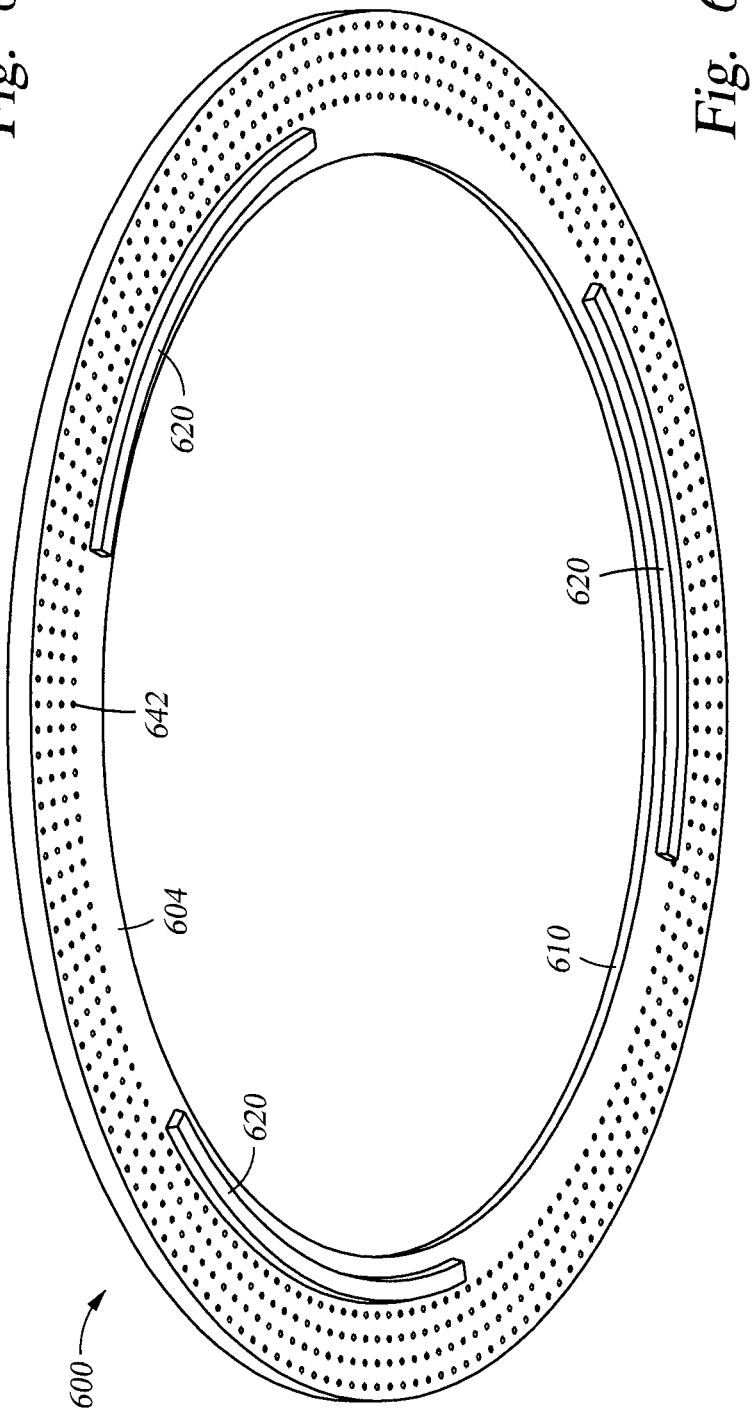

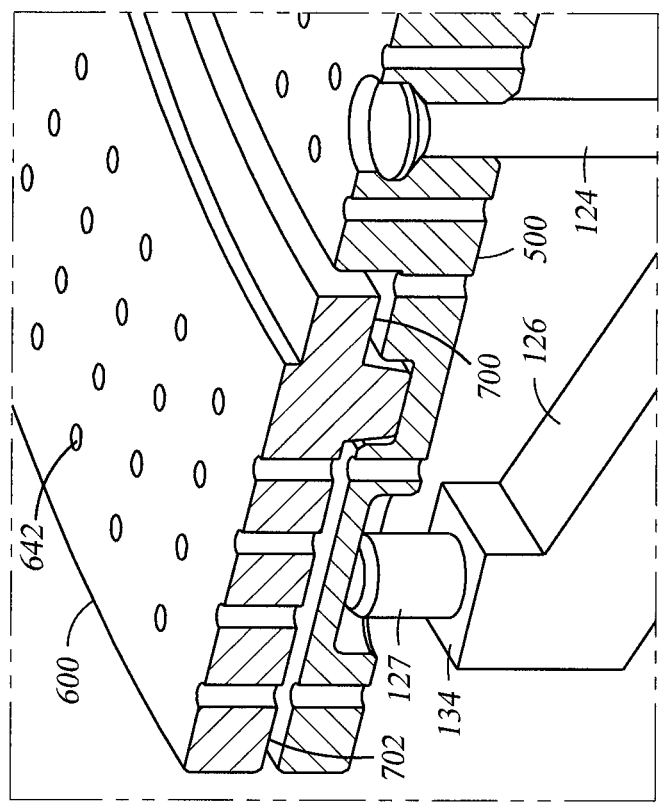
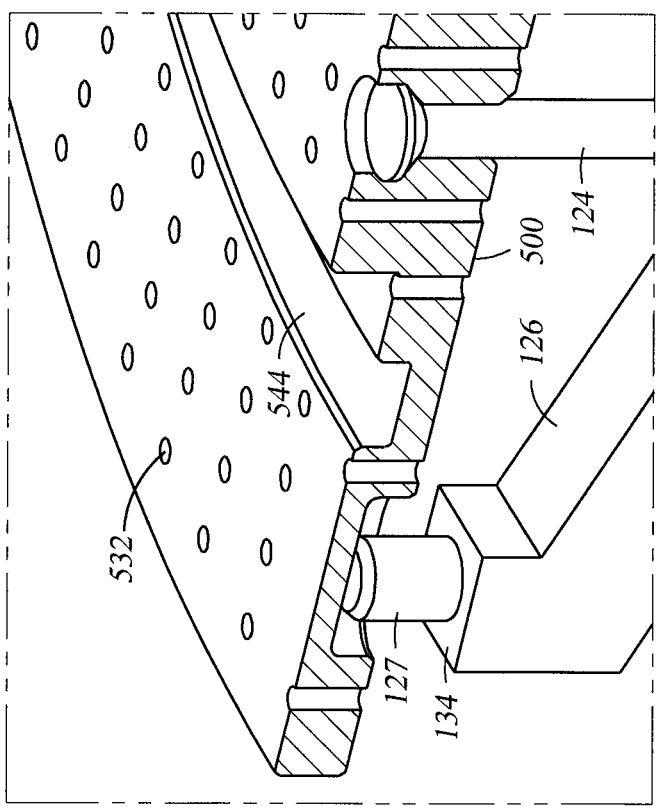
Fig. 7D
Fig. 7C

SUPPORT ASSEMBLY FOR SUBSTRATE BACKSIDE DISCOLORATION CONTROL

CROSS-REFERENCE TO RELATED APPLICATIONS

This application claims priority from U.S. Provisional Application Ser. No. 62/102,375, filed Jan. 12, 2015, which is hereby incorporated by reference in its entirety.

BACKGROUND

Field

A processing chamber for processing a substrate is disclosed herein. More specifically, embodiments disclosed herein relate to a susceptor and a heat plate for use in depositing an epitaxial layer on a substrate.

Description of the Related Art

One type of apparatus for processing semiconductor substrates is a single substrate processor in which one substrate at a time is supported on a susceptor in a processing chamber. The susceptor divides the chamber into one portion, which is below the susceptor, and a second portion, which is above the susceptor. The susceptor is generally mounted on a shaft, which rotates the susceptor about its center to enhance uniform processing of the substrate. A flow of a processing gas is provided in the top of chamber and across the surface of the substrate. The chamber generally has a gas inlet port at one side thereof, and a gas outlet port at an opposite side to achieve a flow of the processing gas across the substrate. The susceptor is heated in order to heat the substrate to a desired processing temperature. One method used to heat the susceptor is by the use of lamps provided around the chamber. The lamps direct light into the chamber and onto the susceptor. In order to control the temperature to which the substrate is being heated, the temperature of the susceptor is constantly measured. The temperature may be measured using an infrared temperature sensor, which detects the infrared radiation emitted from the heated susceptor.

During processing some of the process gas may flow around the edge of the susceptor and deposit a layer of the material on the back surface of the substrate. The layer deposited on the back surface of the substrate results in backside discoloration of the substrate, which is evidence of the contaminated back surface. Contamination of the back surface of the substrate leads to overall yield degradation.

There is a need, therefore, to provide an improved apparatus and method for processing a substrate.

SUMMARY

Embodiments disclosed herein relate to a processing chamber for semiconductor processing. In one embodiment, the processing chamber has a chamber body having an interior volume. A support shaft assembly is disposed in the interior volume. The support shaft assembly includes a support shaft system, a disc shaped heat plate, and a ring shaped susceptor. The support shaft system includes a shaft, a plurality of arms, and a plurality of removable support pins. Each arm has a first end and a second end. The first end of each arm is couple to the shaft. The second end of each arm has a pin receiving recess. The plurality of removable support pins are placed within a respective end of the pin receiving recess. The disc shaped heat plate is support by the support shaft system. The ring shaped susceptor is supported by the plurality of pins in the support shaft system such that there is a gap defined between the heat plate and the susceptor.

In another embodiment, the processing chamber for semiconductor processing includes a chamber body having an interior volume. A support shaft assembly is disposed within the interior volume. The support shaft assembly includes a support shaft system, a disc shaped heat plate, and a ring shaped susceptor. The support shaft system includes a shaft and a plurality of arms. Each arm has a first end and a second end. The first end of each arm is coupled to the shaft. The disc shaped heat plate is supported by the second ends of the plurality of arms. The heat plate has a top surface. The top surface has a plurality of grooves. The ring shaped susceptor has a plurality of fins. The fins are disposed within the plurality of grooves in the heat plate. The fins and the grooves create a gap between the heat plate and the susceptor.

In another embodiment, a method for processing a substrate in a processing chamber is disclosed herein. The method includes flowing a process gas into the processing chamber and flowing a purge gas out from beneath the substrate. The processing chamber has a chamber body having an interior volume. A support shaft assembly is disposed in the interior volume. The support shaft assembly includes a support shaft system, a disc shaped heat plate, and a ring shaped susceptor. The support shaft system includes a shaft, a plurality of arms, and a plurality of removable support pins. Each arm has a first end and a second end. The first end of each arm is couple to the shaft. The second end of each arm has a pin receiving recess. The plurality of removable support pins are placed within a respective end of the pin receiving recess. The disc shaped heat plate is support by the support shaft system. The ring shaped susceptor is supported by the plurality of pins in the support shaft system such that there is a gap defined between the heat plate and the susceptor. The purge gas is flowed into the processing chamber. The purge gas flows beneath the substrate, in the gap defined between the heat plate and the susceptor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3A is a side perspective view of one embodiment of a susceptor, according to one embodiment.

FIG. 3B is a top perspective view of the susceptor of FIG. 3A, according to one embodiment.

FIG. 4C is a side view of the arm in FIG. 4B with a heat plate in place, according to one embodiment.

FIG. 4D is a side view of the arm in FIG. 4C with a susceptor in place, according to one embodiment.

FIG. 6A is a side perspective view of one embodiment of a susceptor, according to one embodiment.

FIG. 6B is a bottom perspective view of the bottom of the susceptor illustrated in FIG. 6A, according to one embodiment.

FIG. 7C is a side view of the arm in FIG. 7B with a heat plate in place, according to one embodiment.

FIG. 7D is a side view of the arm in FIG. 7C with a susceptor in place, according to one embodiment.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
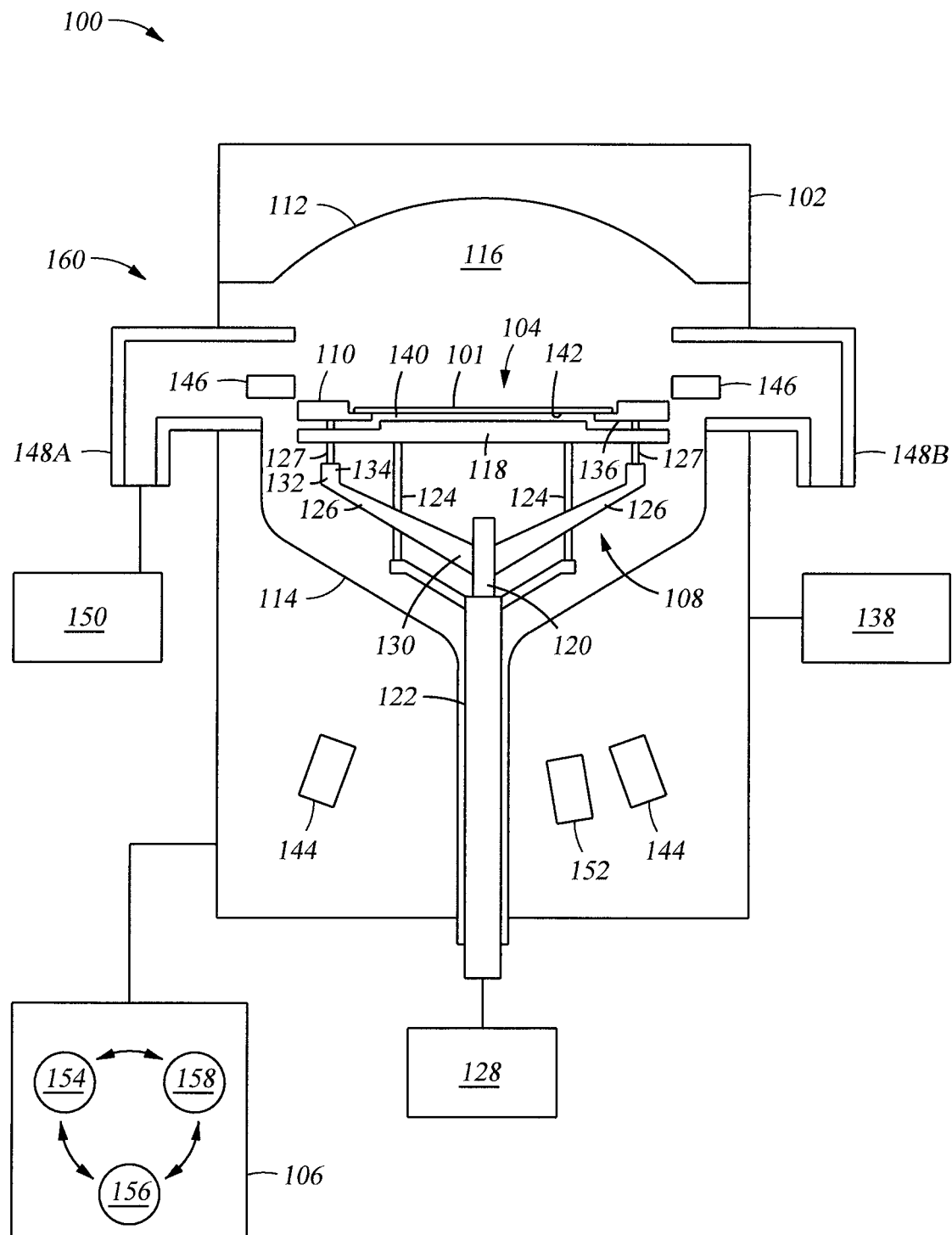
FIG. 1 is a side view of a processing chamber, according to one embodiment.

FIG. 1 is a cross sectional view of a processing chamber 100 according to one embodiment. The processing chamber 100 includes a chamber body 102 and a controller 106. The chamber body 102 includes an upper dome 112, a ring-shaped body 160, and a lower dome 114. The upper dome 112 and the lower dome 114 sandwich the ring-shaped body 160 and define the interior volume 116 of the processing chamber 100. A substrate support assembly 104 is positioned in the interior volume 116 of the chamber body 102.

The substrate support assembly 104 includes a support shaft system 108, a susceptor 110, and a heat plate 118. The support shaft system 108 comprises a shaft 120, a shroud 122, a plurality of lift rods 124, a plurality of arms 126, and a plurality of removable support pins 127. The shaft 120 of the support shaft system 108 is positioned within the shroud 122. An actuator 128 is coupled to the shaft 120 and is configured to rotate the shaft 120 on a central axis. The shroud 122 is generally fixed in position, and therefore, does not rotate during processing.

The plurality of arms 126 is coupled to the shaft 120. The arms 126 extend out radially to support the heat plate 118 and the susceptor 110. Each arm 126 has a first end 130 and a second end 132. The first end 130 of each arm 126 is coupled to the shaft 120. The second end 132 of each arm 126 includes a base member 134 and a pin receiving recess (shown in FIGS. 4A-4B; 7A-7B) formed therein. The pin receiving recess is configured to receive a support pin 127. The pin receiving recess allows for a pin 127 having one size to be replaced with a pin 127 having a different size. For example, a pin 127 having one length may be exchanged for a pin 127 having a different length. Each arm 126 is configured to support a heat plate 118. For example, the support shaft system 108 may include three arms 126 equally spaced, roughly 120 degrees apart. The three points of contact aid in supporting the susceptor 110.

The rods 124 extend through the heat plate 118 and support the susceptor 110. The susceptor 110 is supported above the heat plate 118 such that a gap 136 is defined between the susceptor 110 and the heat plate 118. A purge gas from a purge gas source 138 may flow through the gap 136. The purge gas aids in reducing backside discoloration of the substrate 101 from the deposit of material due to process gas passing below the susceptor 110. The substrate 101 is supported just above the heat plate 118, such that a second gap 140 is formed between the heat plate 118 and the substrate 101. The second gap 140 between the substrate 101 and the heat plate 118 may be the same width as the gap 136 formed between the susceptor 110 and the heat plate 118. The second gap 140 allows process gas to flow beneath the substrate 101, between the substrate 101 and the heat plate 118.

Lift rods 124 are disposed through openings (not shown) formed in the support shaft system 108. The lift rods 124 are vertically actuable. The lift rods 124 are adapted to contact the underside 142 of the substrate 101 to lift the substrate 101 from a processing position (as shown) to a substrate removal position.

The ring-shaped body 160 includes a plurality of ports formed therein. For example, an inlet 148A may be adapted to provide a process gas into the interior volume 116 from the process gas source 150. An exit port 148B is disposed across from the inlet 148A to induce a cross flow of process gas across the substrate 101. In such a manner, the process gas may flow parallel to an upper surface of the substrate 101. The heat source 144 facilitates thermal decomposition of the process gas onto the substrate 101 to form an epitaxial layer (not shown) on the substrate 101.

The ring-shaped body 160 may further include a preheat ring 146. The preheat ring 146 is disposed around the interior volume 116 of the chamber body 102 and circumscribes the substrate 101 while the substrate 101 is in processing position. During processing, the preheat ring 146 is heated by the heat source 144. The preheat ring 146 facilitates preheating of a process gas as the process gas enters the ring-shaped body 160 through the inlet 148A adjacent to the preheat ring 146.

The heat sources 144 may be, for example, lamps, which are adapted to provide thermal energy to components positioned within the processing chamber 100. For example, the heat source 144 may be adapted to provide thermal energy to the substrate 101, a susceptor 110, and/or the preheat ring 146. The lower dome 114 may be formed from an optically transparent material, such as quartz, to facilitate the passage of thermal radiation therethrough. In one embodiment, the heat source 144 may be positioned to provide thermal energy through the upper dome 112 as well as the lower dome 114.

A pyrometer 152 is adapted to measure a temperature of the susceptor 110 and/or the substrate 101. A focal beam (not shown) of the pyrometer 152 is directed through the lower dome 114 and through the shaft 120. The pyrometer 152 measures the temperature of the susceptor 110 (for example, when the susceptor 110 is formed from silicon carbide) or the temperature of the substrate 101 (for example, when the susceptor 110 is formed from quartz or when a susceptor 110 is absent and the substrate 101 is supported in another manner, such as by a ring).

The processing chamber 100 includes components used to execute and monitor pre-determined processes, such as the growth of epitaxial films in the processing chamber 100. The processing chamber 100 includes one or more gas panels, gas distribution conduits, vacuum and exhaust sub-systems, power supplies, and process control instruments. The controller 106 is coupled to the processing chamber 100 and is adapted to control the function of the processing chamber 100.

The controller 106 is operable to control processing of the substrate 101 within the processing chamber 100. The controller 106 includes a programmable central processing unit (CPU) 154 that is operable with a memory 156 and a mass storage device, an input control unit, and a display unit (not shown), such as power supplies, clocks, cache, input/output (I/O) circuits, and the like, coupled to the various components of the processing chamber 100 to facilitate control of the processes of processing a substrate 101. The controller 106 may also include hardware for monitoring the processing of the substrate 101 through sensors (not shown) in the processing chamber 100.

To facilitate control of the processing chamber 100 and processing the substrate 101, the CPU 154 may be one of any form of general purpose computer processors for controlling the substrate process. The memory 156 is coupled to the CPU 154 and the memory 156 is non-transitory and may be one or more of readily available memory such as random access memory (RAM), read only memory (ROM), floppy disk drive, hard disk, or any other form of digital storage, local or remote. Support circuits 158 are coupled to the CPU 154 for supporting the CPU 154 in a conventional manner. The process for processing the substrate 101 is generally stored in the memory 156. The process for processing the substrate 101 may also be stored and/or executed by a second CPU (not shown) that is remotely located from the hardware being controlled by the CPU 154.

The memory 156 is in the form of computer-readable storage media that contains instructions, that when executed by the CPU 154, facilitates the operation of processing the substrate 101 in the processing chamber 100. The instructions in the memory 156 are in the form of a program product such as a program that implements the operation of processing the substrate 101. The program code may conform to any one of a number of different programming languages. In one example, the disclosure may be implemented as a program product stored in computer readable storage media for use with a computer system. The program(s) of the program product define functions of the embodiments. Illustrative computer-readable storage media include, but are not limited to: (i) non-writable storage media (e.g., read-only memory devices within a computer such as CD-ROM disks readable by a CD-ROM drive, flash memory, ROM chips or any tope of solid-state non-volatile semiconductor memory) on which information is permanently stored; and (ii) writing storage media (e.g. floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2A:
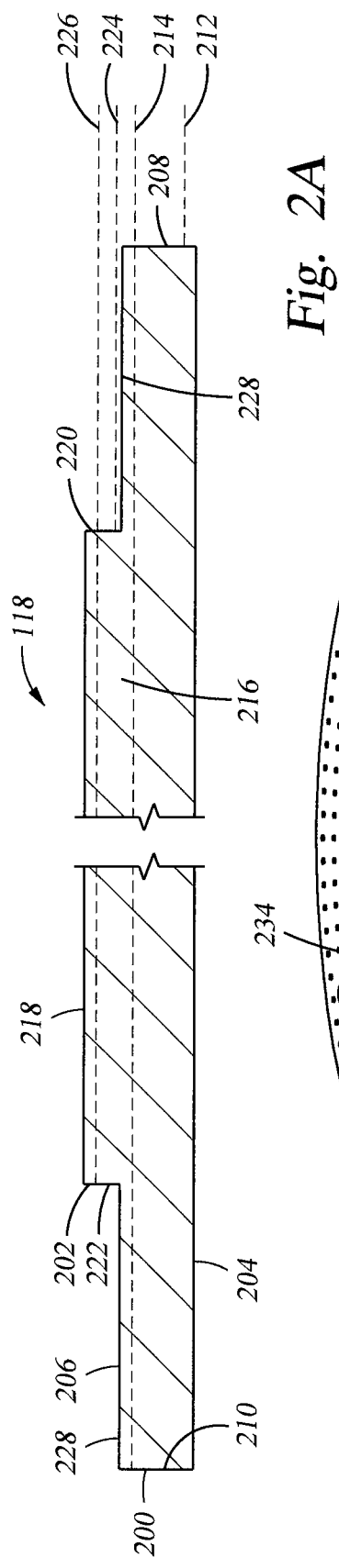
FIG. 2A is a side perspective view of one embodiment of a heat plate, according to one embodiment.

FIG. 2A shows a side view of the heat plate 118. The heat plate 118 includes a first disc shaped body 200 and a second disc shaped body 202. The heat plate 118 may be made of carbon graphite or a silicon graphite coating. The first disc shaped body 200 includes a bottom surface 204, a top surface 206, an inner wall 208, and an outer wall 210. The top surface 206 is opposite of and parallel to the bottom surface 204. The inner wall 208 is perpendicular to the bottom surface 204 and connects the bottom surface 204 to the top surface 206. The inner wall 208 includes an inner diameter 212. The outer wall 210 is opposite the inner wall 208 and connects the top surface 206 to the bottom surface 204. The outer wall 210 includes an outer diameter 214 such that the outer diameter 214 is larger than the inner diameter 212.

The second disc shaped body 202 is concentric with the first disc shaped body 200. The second disc shaped body 202 includes a bottom surface 216, a top surface 218, an inner wall 220, and an outer wall 222. The top surface 218 is opposite of and parallel to the bottom surface 216. The bottom surface 216 is coupled to the top surface 206 of the first disc shaped body 200. The inner wall 220 is perpendicular to the bottom surface 216 and connects the bottom surface 216 to the top surface 218. The inner wall 220 has an inner diameter 224 such that the inner diameter 224 is greater than the inner diameter 212 of the first disc shaped body 200. The outer wall 222 is opposite of and parallel to the inner wall 220. The outer wall 222 connects the bottom surface 216 to the top surface 218. The outer wall 222 has an outer diameter 226, such that the outer diameter 226 is greater than the inner diameter 224 and less than the outer diameter 214 of the first disc shaped body 200. The first disc shaped body 200 and the second disc shaped body 202 define a ledge 228 in the top surface 206 of the first disc shaped body 200.

Figure 2B:
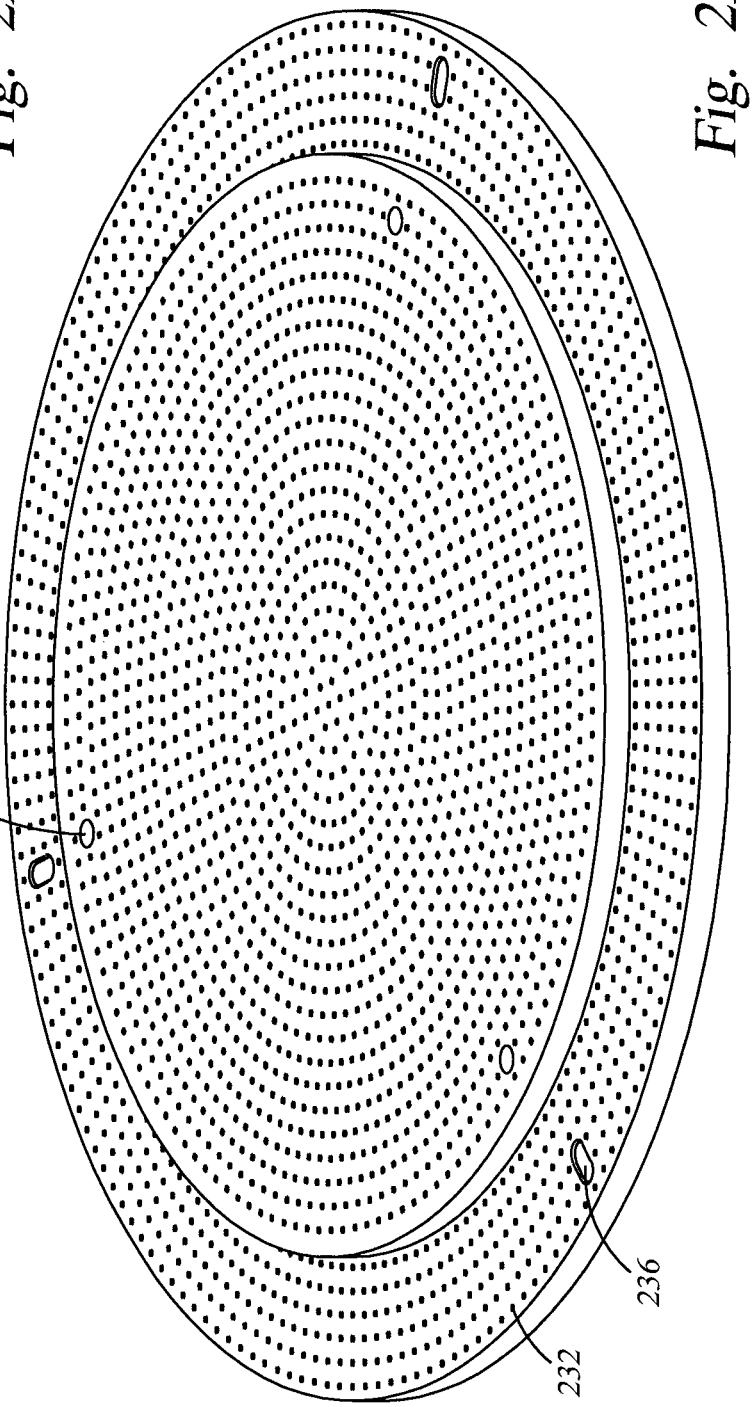
FIG. 2B is a top perspective view of the heat plate of FIG. 2A, according to one embodiment.

FIG. 2B is a top perspective view of the heat plate 118. The heat plate 118 further includes a plurality of holes 232, 234, 236 formed therethrough. The second disc shaped body 202 includes two sets of holes 232, 234. Both sets of holes 232, 234 provide for fluid communication between the top surface 218 of the second disc shaped body 202 and the bottom surface 204 of the first disc shaped body 200. The first set of holes 232 has a diameter smaller than the second set of holes 234. The heat plate 118 has a hole density of about 5.25 holes per square centimeter and allows a purge gas to be flowed beneath the substrate (not shown). The second set of holes 234 is equally spaced around the circumference of the second disc shaped body 202, such as, for example three holes 120 degrees apart from each other. The second set of holes 234 is configured such that the support tip (not shown) can extend through the holes 234 and raise/lower a substrate from/onto the susceptor (not shown).

The third set of holes 236 is disposed on the ledge 228 of the heat plate 118. The third set of holes 236 provides for fluid communication between the ledge 228 and the bottom surface 204 of the first disc shaped body 200. The third set of holes 236 is configured such that the support pins (not shown) may extend through the holes 236 to support the susceptor. The third set of holes 236 may be spaced evenly along the ledge 228, such as, for example, 120 degrees apart from each other.

FIG. 3A is a side perspective view of a portion of the susceptor 110. The susceptor 110 comprises a ring shaped body 300. The susceptor 110 may be made out of the same material as the heat plate 118, such as, for example, carbon graphite or the susceptor 110 may have a silicon graphite coating. The ring shaped body 300 includes a bottom surface 302, a top surface 304, an outer wall 306, an inner wall 308, an indented wall 310, and a ledge 312. The bottom surface 302 has a first length 314, and is opposite of and parallel to the top surface 304. The bottom surface 302 is configured to contact the top surface of the support pin, as shown in FIG. 4D. The top surface 304 includes a second length 316.

The outer wall 306 is perpendicular to the bottom surface 302, and includes a first height 318 and an outer diameter 320. The outer wall 306 connects the top surface 304 to the bottom surface 302. The inner wall 308 includes a second height 322 and an inner diameter 324, wherein the inner diameter 324 is less than the outer diameter 320. The outer wall 306 is perpendicular to the bottom surface 302. The indented wall 310 is perpendicular to the bottom surface 302, and includes a diameter 326 that is greater than the inner diameter 324 and less than the outer diameter 320, and a third height 328. The third height 328 of the indented wall 310 is such, that the third height 328 of the indented wall 310 plus the second height 322 of the inner wall 308 substantially equals the first height 318 of the outer wall 306.

The ledge 312 is defined by the inner wall 308 and the indented wall 310. The ledge 312 is parallel to the bottom surface 302, and has a length such that the length 330 of the ledge 312 plus the second length 316 of the top surface 304 substantially equals the first length 314 of the bottom surface 302.

FIG. 3B is a top perspective view of the susceptor. The ledge 312 further includes a plurality of holes 332 formed therethrough. The plurality of holes 332 in the ledge 312 provide for fluid communication with the bottom surface 302. The plurality of holes 332 in the ledge 312 is aligned with the plurality of holes (not shown) in the ledge of the heat plate (not shown) such that a purge gas can flow from beneath the heat plate through the heat plate, through the gap, and through the susceptor 110. The susceptor 110 has a hole density of about 5.99 holes per square centimeter.

Figure 4B:
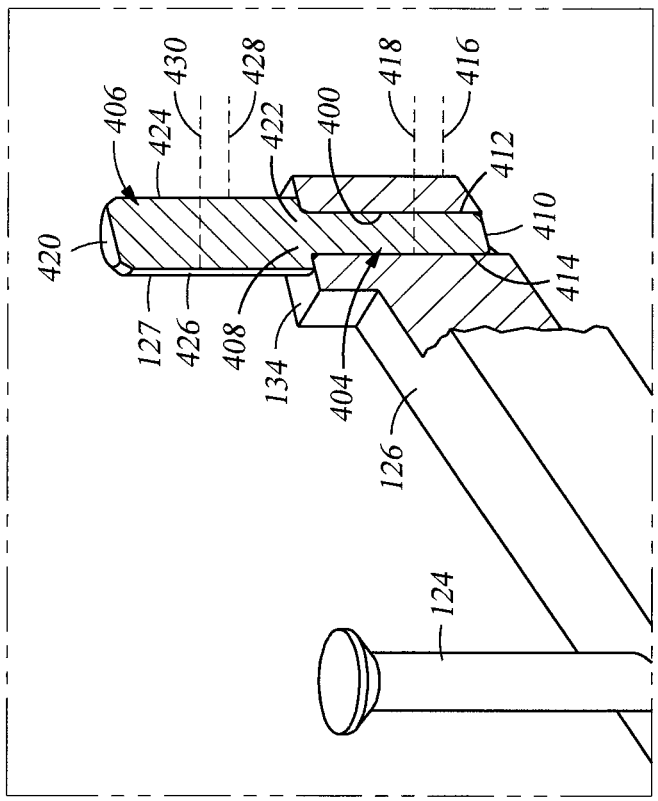
FIG. 4B is a side view of the arm in FIG. 4A with a support tip in place, according to one embodiment.
Figure 4A:
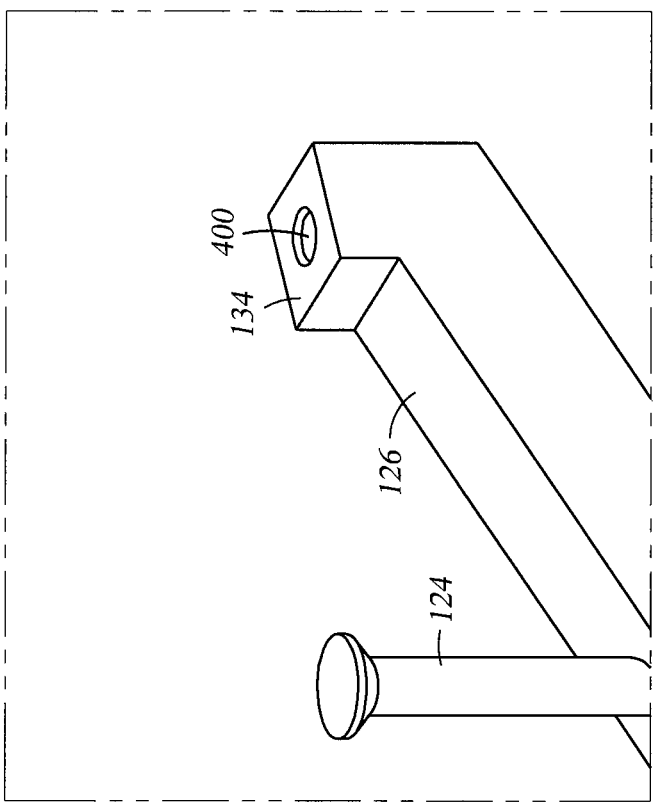
FIG. 4A is a side view of one embodiment of an arm from the support shaft assembly, according to one embodiment.

FIG. 4A is a side perspective view of an arm 126 of the support shaft system 108. The arm 126 of the support shaft system 108 includes two ends, a first end (not shown), and a second end 132. The second end 132 has a base member 134 in which the pin receiving recess 400 is formed. The pin receiving recess 400 is configured to receive interchangeable pins (as shown in FIG. 4B) such that the gap between the heat plate and the susceptor may be altered (as shown in FIG. 4D). The pin receiving recess 400 is also configured to support the susceptor. The base member 134 is configured to support the heat plate. For example, the gap between the heat plate and the susceptor may be at least 0.1 mm, such as in a range from 0.1 mm to 1 mm.

FIG. 4B is a side perspective view of the arm 126 of FIG. 4A with a support pin 127 in place. The support pins 127 include a first cylindrical portion 404 and a second cylindrical portion 406. The pins 127 may be made from SiC. The first cylindrical portion 404 includes a top surface 408, a bottom surface 410, an inner wall 412 and an outer wall 414. The top surface 408 is opposite of and parallel to the bottom surface 410. The inner wall 412 and the outer wall 414 are parallel to each other and perpendicular to the bottom surface 410. The walls 412, 414 connect the top surface 408 to the bottom surface 410. The inner wall 412 further includes an inner diameter 416. The outer wall 414 further includes an outer diameter 418, wherein the outer diameter 418 is greater than the inner diameter 416.

The second cylindrical portion 406 includes a top surface 420, a bottom surface 422, an inner wall 424, and an outer wall 426. The top surface 420 is opposite of and parallel to the bottom surface 422. The bottom surface 422 of the second cylindrical portion 406 is coupled to the top surface 420 of the first cylindrical portion 404. The inner wall 424 is parallel to the outer wall 426, and both walls 424, 426 are perpendicular to the bottom surface 422. The walls 424, 426 connect the top surface 420 to the bottom surface 422. The inner wall 424 further includes an inner wall diameter 428, wherein the inner wall diameter 428 is less than the inner diameter 416 of the first cylindrical portion 404. The outer wall 426 further includes an outer diameter 430, wherein the outer diameter 430 is greater than the outer diameter 418 of the first cylindrical portion 404.

FIG. 4C is a side perspective view of the arm 126 of FIG. 4B with the heat plate 118 in place. The heat plate 118 is supported by the support shaft system 108. The base member 134 of the arm 126 contacts the heat plate 118, and supports the heat plate 118. The plurality of pins 127 extends through the holes 234 formed in the heat plate 118. The plurality of pins 127 is configured to support the susceptor (not shown).

FIG. 4D is a side perspective view of the arm 126 of FIG. 4C with the susceptor 110 in place. The bottom surface 302 of the susceptor 110 is supported by the top surface 420 of the second cylindrical portion 406 of the support pin 127 such that a gap 136 is created between the bottom surface 302 of the susceptor 110 and the top surfaces 206, 218 of the heat plate 118. The gap 136 allows for purge gas provided from the bottom of the chamber 100 to flow out from beneath the substrate 101 during processing resulting in a decrease deposition on the back surface of the substrate from the process gas. Additionally, the holes 232 in the heat plate 118 are aligned with the holes 332 in the susceptor 110, when the heat plate 118 and the susceptor 110 are supported by the arm 126. The hole alignment allows the purge gas to reach the upper dome 112 of the chamber 100. The holes 232, 332 also function to reduce turbulence between the purge gas rising in a vertical direction and the process gas flowing across the surface of the substrate in a horizontal direction. The holes 232, 332 slow down the rate at which the purge gas rises in the chamber 100, which thus causes less turbulence when meeting the process gas. The reduction in turbulence also allows for a smother deposition of material on the substrate.

Figure 5A:
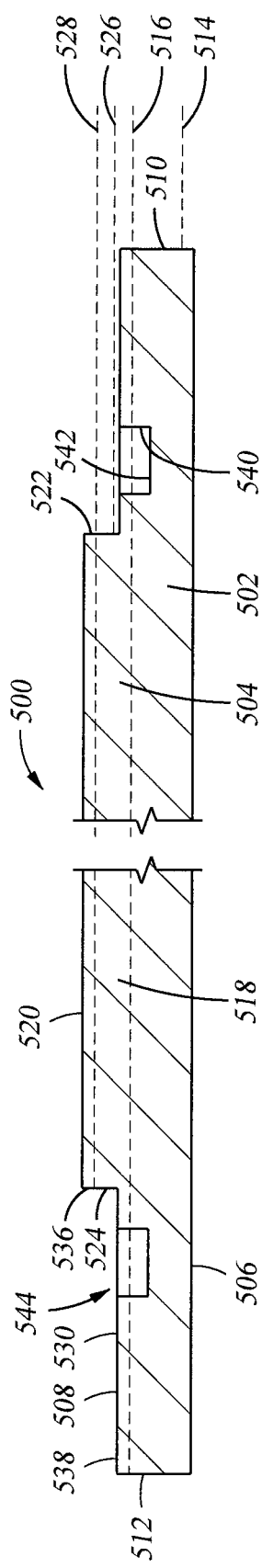
FIG. 5A is a side perspective view of one embodiment of a heat plate, according to one embodiment.

FIG. 5A is a side perspective view of another embodiment of a heat plate 500. The heat plate 500 includes a first disc shaped body 502 and a second disc shaped body 504. The first disc shaped body 502 includes a bottom surface 506, a top surface 508, an inner wall 510, and an outer wall 512. The top surface 508 is opposite of and parallel to the bottom surface 506. The inner wall 510 is perpendicular to the bottom surface 506 and connects the bottom surface 506 to the top surface 508. The inner wall 510 includes an inner diameter 514. The outer wall 512 is opposite the inner wall 510 and connects the top surface 508 to the bottom surface 506. The outer wall 512 includes an outer diameter 516 such that the outer diameter 516 is larger than the inner diameter 514.

The top surface 508 further includes a first plane 536 and a second plane 538. The first plane 536 sits above the second plane 538. The second plane 538 includes two side walls 540 perpendicular to the bottom surface 506. The two side walls 540 connect the first plane 536 to the second plane 538. A lower wall 542 is parallel to the bottom surface 506, and connects the two side walls 540. The lower wall 542 is perpendicular to the side walls 540. The two side walls 540 and lower wall 542 define a groove 544 in the top surface 508 of the first disc shaped body 502. The groove 544 is configured to receive a portion of the susceptor (as shown in FIG. 7D).

The second disc shaped body 504 is concentric with the first disc shaped body 502. The second disc shaped body 504 includes a bottom surface 518, a top surface 520, an inner wall 522, and an outer wall 524. The top surface 520 is opposite of and parallel to the bottom surface 518. The bottom surface 518 is coupled to the top surface 520 of the first disc shaped body 502. The inner wall 522 is perpendicular to the bottom surface 518 and connects the bottom surface 518 to the top surface 520. The inner wall 522 has an inner diameter 526 such that the inner diameter 526 is greater than the inner diameter 526 of the first disc shaped body 502. The outer wall 524 is opposite of and parallel to the inner wall 522. The outer wall 524 connects the bottom surface 518 to the top surface 520. The outer wall 524 has an outer diameter 528, such that the outer diameter 528 is greater than the inner diameter 526 and less than the outer diameter 516 of the first disc shaped body 502. The first disc shaped body 502 and the second disc shaped body 504 define a ledge 530 in the top surface 508 of the first disc shaped body 502.

Figure 5B:
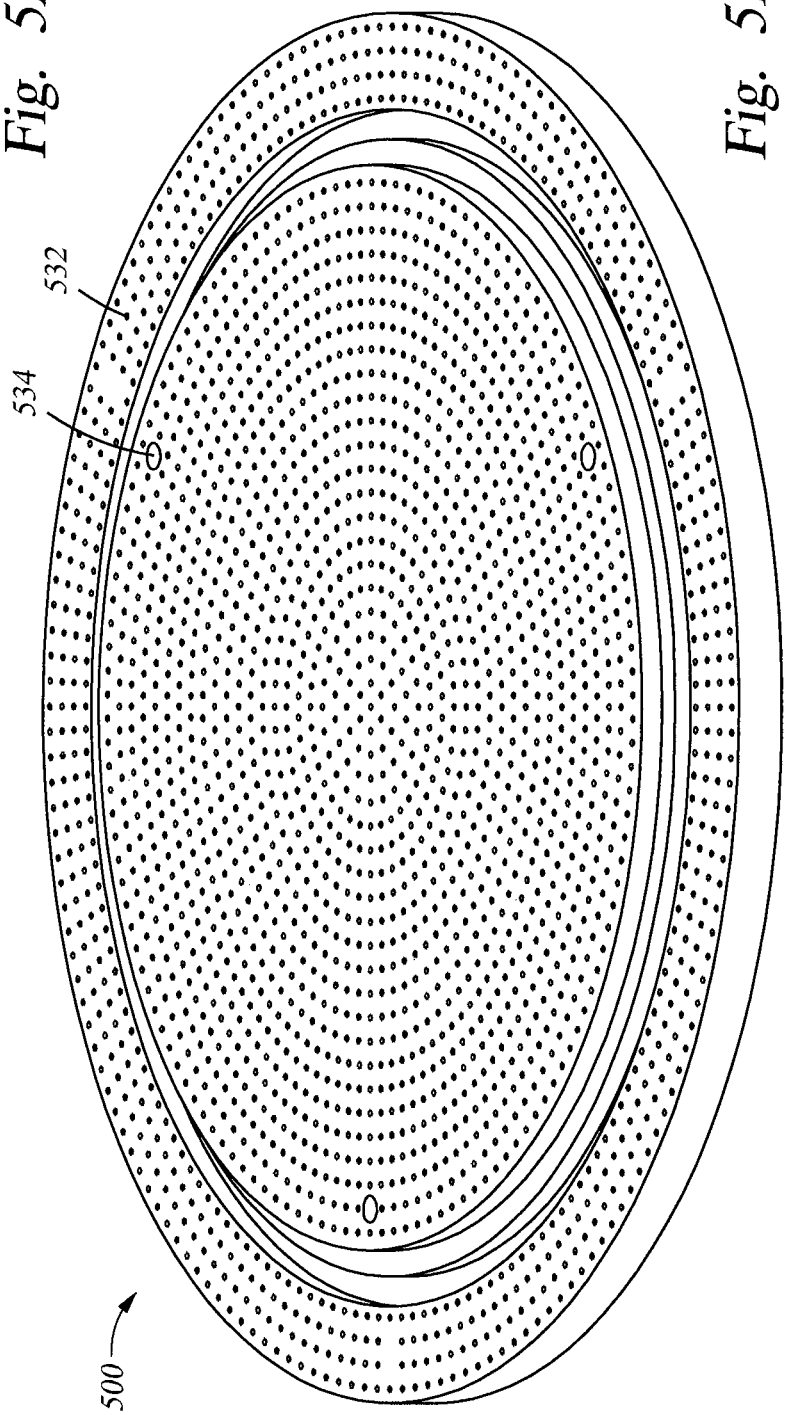
FIG. 5B is a bottom perspective view of the heat plate illustrate in FIG. 5A, according to one embodiment.

FIG. 5B illustrates a bottom perspective view of the heat plate 500 illustrated in FIG. 5A. The ledge 530 includes a first plurality of holes 532 formed therethrough and a second plurality of holes 534 formed therethrough. The first plurality of holes 532 provides for fluid communication between the top surface 508 of the first disc shaped body 502 and the bottom surface 518 of the first disc shaped body 502. The holes 532 have a first diameter. The second plurality of holes 534 provides for fluid communication between the top surface 508 of the first disc shaped body 502 and the bottom surface 518 of the second disc shaped body 504. The second plurality of holes 534 has a second diameter, wherein the second diameter is larger than the first diameter. The second plurality of holes 534 is configured to receive the lift tips such that the substrate can be removed or placed in the interior region of the processing chamber (as shown in FIG. 7D). The heat plate 500 has a hole density of about 5.25 holes per square centimeter.

FIG. 6A is a side perspective view of another embodiment of the susceptor 600. The susceptor 600 comprises a disc shaped body 602. The disc shaped body 602 includes a bottom surface 604, a top surface 606, an outer wall 608, an inner wall 610, an indented wall 612, and a ledge 614. The top surface 606 includes a first length 616. The bottom surface 604 has a second length 618, and is opposite of and parallel to the top surface 606. The bottom surface 604 is configured to contact the top surface of the support tip (as shown in FIG. 7D).

The bottom surface 604 further includes a plurality of fins 620 coupled thereto. The fins 620 extend below the bottom surface 604 of the susceptor 600 and include two side walls 622 and a bottom surface 624. The bottom surfaces 624 of the fins 620 are opposite of and parallel to the bottom surface 604 of the susceptor 600. The two side walls 622 are perpendicular to the bottom surface 624 and connect the bottom surface 604 of the susceptor 600 to the bottom surface 624 of the fin 620. The fins 620 are configured to sit within the groove (as shown in FIG. 7D) of the heat plate. The plurality of fins 620 is concentric with the heat plate and the susceptor. The fins 620 support the susceptor 600 such that there is a gap between the bottom surface 604 of the susceptor 600 and the top surface of the heat plate. The gap allows for a purge gas to flow out from beneath the substrate such that the backside of the substrate is not discolored by unwanted deposition.

The outer wall 608 includes a first height 628, an outer diameter 630, and is perpendicular to the bottom surface 604. The outer wall 608 connects the top surface 606 to the bottom surface 604. The inner wall 610 includes a second height 632, an inner diameter 634, wherein the inner diameter 634 is less than the outer diameter 630. The outer wall 608 is perpendicular to the bottom surface 604. The indented wall 612 is perpendicular to the bottom surface 604, and includes a diameter 638 that is greater than the inner diameter 634 and less than the outer diameter 630, and a height 636. The height 636 of the indented wall 612 is such, that the height 636 of the indented wall 612 plus the height 636 of the inner wall 610 substantially equals the first height 628 of the outer wall 608.

The ledge 614 is defined by the inner wall 610 and the indented wall 612. The ledge 614 is parallel to the bottom surface 604, and has a length 640 such that the length 640 of the ledge 614 plus the first length 616 of the top surface 606 substantially equals the second length 618 of the bottom surface 604.

FIG. 6B illustrates a bottom perspective view of the susceptor in FIG. 6A. The ledge 614 further includes a plurality of holes 642 formed therethrough. The plurality of holes 642 in the ledge 614 provide for fluid communication with the bottom surface 604. The plurality of holes 642 in the ledge 614 are aligned with the plurality of holes in the ledge of the heat plate such that a purge gas can flow from beneath the heat plate through the heat plate, through the gap, and through the susceptor 600. The susceptor 600 has a hole density of about 6.06 holes per square centimeter.

Figure 7B:
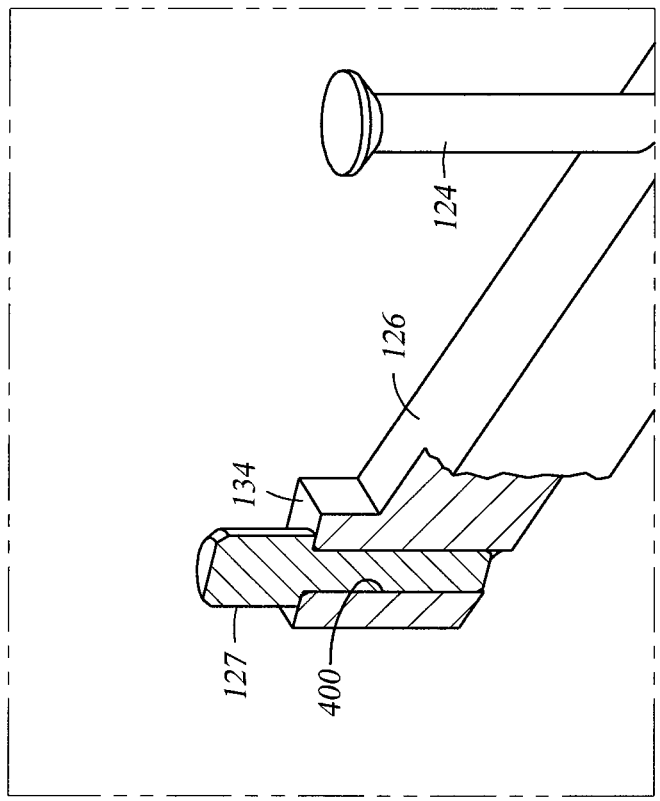
FIG. 7B is a side view of the arm in FIG. 7A with a support tip in place, according to one embodiment.
Figure 7A:
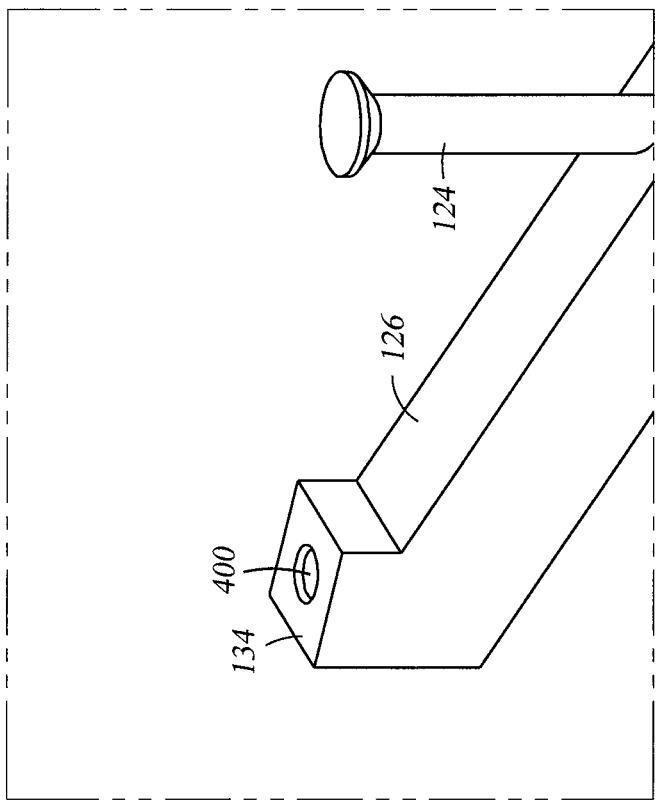
FIG. 7A is a side view of one embodiment of an arm from the support shaft assembly, according to one embodiment.

FIG. 7A is a side perspective view of an arm 126 of the support shaft system 108. The arm 126 of the support shaft system 108 includes two ends, a first end 130 (not shown) and a second end 132. The second end 132 includes a base member 134 and a pin receiving recess 400 formed within the base. The pin 127 may be changed such that the height of the support shaft system 108 can be varied, which in turn sets the distance across the gap 702 (as shown in FIG. 7D).

FIG. 7B is a side perspective view of the arm 126 of FIG. 7A with a support pin 127 in place. The support pin 127 is in place when the second cylindrical portion 406 is positioned within the pin receiving recess 400. The bottom surface 422 of the second cylindrical portion 406 of the support pin 127 contacts the base member 134 of the arm 126 when the support pin 127 is in place.

FIG. 7C is a side perspective view of the arm 126 of FIG. 7B with the heat plate 500 in place. The top surface 520 of the pin 127 contacts the bottom surface 506 of the heat plate 500, such that the pins 127 support the heat plate 500. The pins 127 are equally disposed around the heat plate 500, such as, for example, three pins 127 are disposed 120 degrees apart.

FIG. 7D is a side perspective view of the arm 126 of FIG. 7C with the susceptor 600 in place. The susceptor 600 is disposed atop the heat plate 500 such that fins 620 of the susceptor 600 lie within the groove 544 of the heat plate 500. The fins 620 have a height 700 such that a gap 702 is formed between the susceptor 600 and the heat plate 500. The gap 702 allows for purge gas to flow out from beneath the substrate (not shown) during processing resulting in a decrease in backside discoloration of the substrate from the unwanted deposited material. Additionally, the holes 532 in the heat plate 500 are aligned with the holes 642 in the susceptor 600, when the heat plate 500 and the susceptor 600 are supported by the arm 126. The hole alignment allows for the purge gas to reach the upper dome of the chamber. The holes 532, 642 also function as a way to limit turbulence between the purge gas rising in a vertical direction and the process gas flowing across the surface of the substrate in a horizontal direction. The holes 532, 642 slow down the rate at which the purge gas rises in the chamber so that turbulence between the gases can be reduced. The reduction in turbulence allows for more uniform deposition on the upper surface of the substrate 101.

While the foregoing is directed to embodiments of the present disclosure, other and further embodiments of the disclosure may be devised without departing from the basic scope thereof, and the scope thereof is determined by the claims that follow.

What is claimed is:

1. A processing chamber for semiconductor processing, the processing chamber comprising:
a chamber body having an interior volume;
a support shaft assembly disposed in the interior volume, the support shaft assembly comprising:
a support shaft system comprising:
a shaft;
a plurality of arms, each arm having a first end and a second end, the first end of each arm coupled to the shaft, the second end of each arm having a pin receiving recess; and
a plurality of removable support pins, each pin placed within a respective end of the pin receiving recess;
a disc shaped heat plate supported by the support shaft system, wherein the disc shaped heat plate comprises:
a first surface;
a second surface;
a third surface opposite the first surface and the second surface, the first surface vertically lower than the second surface;
a plurality of holes, each hole of the plurality of holes has a top opening and a lower opening, the lower opening exposed to an interior volume of the processing chamber, the plurality of holes formed through the disc shaped heat plate, wherein a first group of the plurality of holes extends from the first surface to the third surface, and a second group of the plurality of holes extends from the second surface to the third surface; and
a ring shaped susceptor supported by the plurality of removable support pins in the support shaft system such that there is a gap defined between the disc shaped heat plate and the ring shaped susceptor, wherein the ring shaped susceptor has a plurality of susceptor holes formed therein, the plurality of susceptor holes align with the first group of the plurality of holes.

2. The processing chamber of claim 1, wherein the ring shaped susceptor comprises:
a ledge configured to receive a substrate.

3. The processing chamber of claim 1, wherein each arm in the plurality of arms comprises:
a base member, wherein the base member supports the disc shaped heat plate.

4. The processing chamber of claim 1, wherein a portion of the plurality of holes formed in the disc shaped heat plate has a hole density of about 5.25 holes per square centimeter.

5. The processing chamber of claim 1, wherein the disc shaped heat plate comprises a fourth surface substantially orthogonal to the first surface, the fourth surface directly connecting the first surface and the third surface.

6. The processing chamber of claim 5, wherein the plurality of holes formed in the ring shaped susceptor has a hole density of about 5.99 holes per square centimeter.

7. The processing chamber of claim 6, wherein a portion of the plurality of holes formed in the disc shaped heat plate has a hole density of about 5.25 holes per square centimeter.

8. The processing chamber of claim 1, wherein the gap between the disc shaped heat plate and the ring shaped susceptor is at least 0.1 mm.

9. A processing chamber for semiconductor processing, the processing chamber comprising:
a chamber body having an interior volume;
a support shaft assembly disposed in the interior volume, the support shaft assembly comprising:
a support shaft system, the support shaft system comprising:
a shaft; and
a plurality of arms, each arm having a first end and a second end, the first end of each arm coupled to the shaft;
a disc shaped heat plate supported by the support shaft system, the disc shaped heat plate having a top surface further comprising a plurality of grooves, wherein the disc shaped heat plate comprises:
a first surface;
a second surface;
a third surface opposite the first surface and the second surface, the first surface vertically lower than the second surface;
a plurality of holes, each hole of the plurality of holes has a top opening and a lower opening, the lower opening exposed to an interior volume of the processing chamber, the plurality of holes formed through the disc shaped heat plate, wherein a first group of the plurality of holes extends from the first surface to the third surface, and a second group of the plurality of holes extends from the second surface to the third surface; and
a ring shaped susceptor having a plurality of fins, the plurality of fins disposed within the plurality of grooves of the disc shaped heat plate such that there is a gap between the disc shaped heat plate and the ring shaped susceptor, wherein the ring shaped susceptor has a plurality of susceptor holes formed therein, the plurality of susceptor holes align with the first group of the plurality of holes.

10. The processing chamber of claim 9, wherein a portion of the plurality of holes formed in the disc shaped heat plate has a hole density of about 5.25 holes per square centimeter.

11. The processing chamber of claim 9, wherein the disc shaped heat plate comprises a fourth surface substantially orthogonal to the first surface, the fourth surface directly connecting the first surface and the third surface.

12. The processing chamber of claim 11, wherein the plurality of holes formed in the ring shaped susceptor has a hole density of about 6.06 holes per square centimeter.

13. The processing chamber of claim 12, wherein a portion of the plurality of holes formed in the disc shaped heat plate has a hole density of about 5.25 holes per square centimeter.

14. The processing chamber of claim 9, wherein the gap between the disc shaped heat plate and the ring shaped susceptor is at least 0.1 mm.

15. The processing chamber of claim 9, wherein the ring shaped susceptor further comprises:
a ledge configured to receive a substrate.

16. A method for processing a substrate in a processing chamber, the method comprising:
flowing a process gas into the processing chamber, the processing chamber further comprising:
a chamber body having an interior volume;
a support shaft assembly disposed in the interior volume, the support shaft assembly comprising:
a support shaft system comprising:
a shaft;
a plurality of arms, each arm having a first end and a second end, the first end of each arm coupled to the shaft, the second end of each arm having a pin receiving recess; and
a plurality of removable support pins, each pin placed within a respective end of the pin receiving recess;

a disc shaped heat plate supported by the support shaft system, the disc shaped heat plate having a top surface further comprising a plurality of grooves, wherein the disc shaped heat plate comprises:

a first surface;

a second surface;

a third surface opposite the first surface and the second surface, the first surface vertically lower than the second surface;

a plurality of holes, each hole of the plurality of holes has a top opening and a lower opening, the lower opening exposed to an interior volume of the processing chamber, the plurality of holes formed through the disc shaped heat plate, wherein a first group of the plurality of holes extends from the first surface to the third surface, and a second group of the plurality of holes extends from the second surface to the third surface; and a ring shaped susceptor supported by the plurality of removable support pins in the support shaft system such that there is a gap defined between the disc shaped heat plate and the ring shaped susceptor, wherein the ring shaped susceptor has a plurality of susceptor holes formed therein, the plurality of susceptor holes align with the first group of the plurality of holes; and flowing a purge gas out from beneath the substrate, through the gap formed between the disc shaped heat plate and the ring shaped susceptor.

17. The method of claim 16, wherein the disc shaped heat plate comprises a fourth surface substantially orthogonal to the first surface, the fourth surface directly connecting the first surface and the third surface.

* * * * *